US012787604B2

(12) United States Patent
Hanari

(10) Patent No.: US 12,787,604 B2
(45) Date of Patent: Nov. 3, 2026

(54) DISPLAY DEVICE

(71) Applicant: Magnolia White Corporation, Tokyo (JP)

(72) Inventor: Jun Hanari, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 467 days.

(21) Appl. No.: 18/477,616

(22) Filed: Sep. 29, 2023

(65) Prior Publication Data

US 2024/0114751 A1 Apr. 4, 2024

(30) Foreign Application Priority Data

Sep. 30, 2022 (JP) ................................ 2022-158436

(51) Int. Cl.
*H10K 59/80* (2023.01)
*H10K 59/122* (2023.01)

(52) U.S. Cl.
CPC ....... *H10K 59/8722* (2023.02); *H10K 59/122* (2023.02); *H10K 59/873* (2023.02)

(58) Field of Classification Search
CPC ........................... H10K 59/122; H10K 59/873
See application file for complete search history.

(56) References Cited

U.S. PATENT DOCUMENTS 7,834,543 B2 * 11/2010 Takata ............ H10K 59/80522 445/24
10,720,486 B2 * 7/2020 Lhee .................... H10K 59/131
2004/0160170 A1 8/2004 Sato et al.
2009/0009069 A1 1/2009 Takata
2019/0326549 A1 10/2019 Kokame et al.
2019/0363146 A1 * 11/2019 Takahashi ............ H10K 59/873
2019/0363275 A1 11/2019 Ochi et al.
2020/0295310 A1 * 9/2020 Moon .................... H10K 59/38
2021/0271336 A1 * 9/2021 Yamanaka ............. H10K 59/40
2022/0077251 A1 3/2022 Choung et al.
2022/0077257 A1 * 3/2022 Choung ............... H10K 59/173
2024/0090300 A1 * 3/2024 Hanari ................. H10K 59/871

FOREIGN PATENT DOCUMENTS

JP 2000-195677 A 7/2000
JP 2004-207217 A 7/2004
JP 2008-135325 A 6/2008
JP 2009-032673 A 2/2009
JP 2010-118191 A 5/2010
JP 2012-182121 A 9/2012
WO 2018/179308 A1 10/2018

OTHER PUBLICATIONS

Office Action issued Sep. 1, 2026, in JP Application No. 2022-158436, 9pp.

* cited by examiner

*Primary Examiner* — Mariceli Santiago
(74) *Attorney, Agent, or Firm* — XSENSUS LLP

(57) ABSTRACT

According to an embodiment, a display device comprises a first substrate, a lower electrode, a rib including a pixel aperture, a partition on the rib, an organic layer covering the lower electrode, an upper electrode covering the organic layer, a first sealing layer formed of an inorganic material to continuously cover a thin film including the organic layer and the upper electrode, and the partition, a resin layer covering the first sealing layer, a second sealing layer formed of an inorganic material to cover the resin layer, a second substrate facing the second sealing layer, and an adhesive layer adhering the second sealing layer and the second substrate.

14 Claims, 17 Drawing Sheets

DISPLAY DEVICE

CROSS-REFERENCE TO RELATED APPLICATION

This application is based upon and claims the benefit of priority from Japanese Patent Application No. 2022-158436, filed Sep. 30, 2022, the entire contents of which are incorporated herein by reference.

FIELD

Embodiments described herein relate generally to a display device.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

In general, the organic layer has a low resistance to moisture. If moisture reaches the organic layer for some reason, this can be a factor of causing degradation in display quality, such as a decrease in the luminance of a display element when emitting light. Further, if moisture enters a drive circuit provided in a surrounding area around a display area, the elements constituting the drive circuit may be degraded.

DETAILED DESCRIPTION

Figure 1:
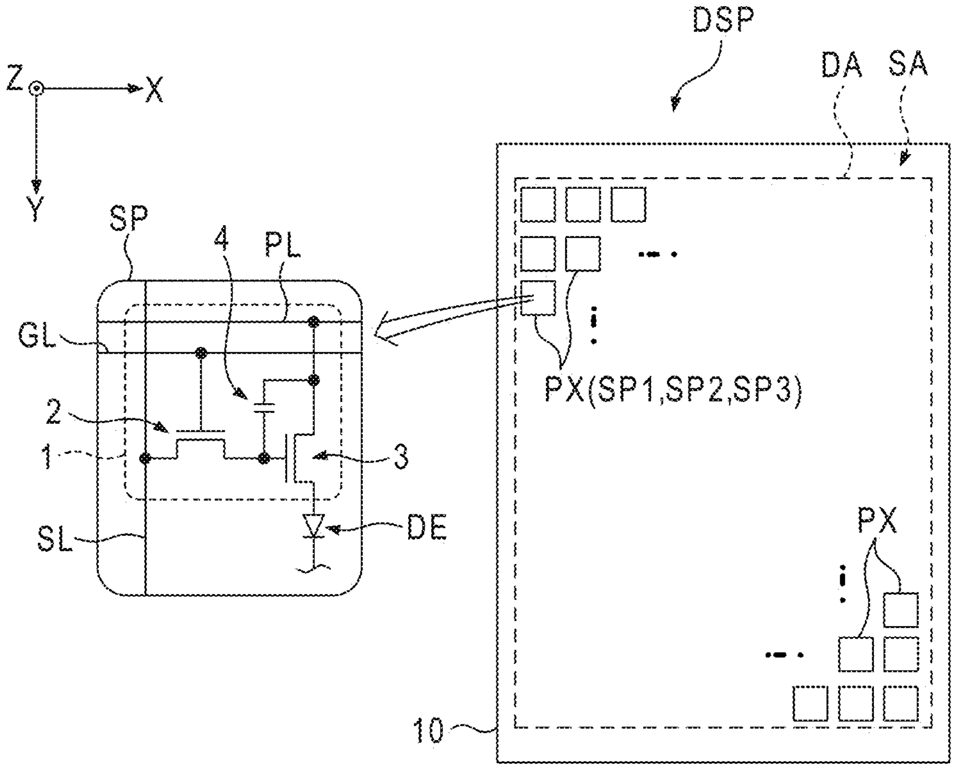
FIG. 1 is a view showing a configuration example of a display device according to a first embodiment.

In general, according to an embodiment, a display device comprises: a first substrate; a lower electrode arranged above the first substrate, in a display area including a pixel; a rib including a pixel aperture overlapping with the lower electrode; a partition arranged on the rib in the display area; an organic layer which covers the lower electrode through the pixel aperture and which emits light in accordance with application of a voltage; an upper electrode covering the organic layer; a first sealing layer formed of an inorganic material to continuously cover a thin film including the organic layer and the upper electrode, and the partition; a resin layer covering the first sealing layer; a second sealing layer formed of an inorganic material to cover the resin layer; a second substrate facing the second sealing layer; and an adhesive layer adhering the second sealing layer and the second substrate.

The configuration described above can provide a display device having an improved resistance to moisture.

Several embodiments will be described hereinafter with reference to the accompanying drawings.

The disclosure is merely an example, and proper changes within the spirit of the invention, which are easily conceivable by a person of ordinary skill in the art, are included in the scope of the invention as a matter of course. In addition, in some cases, in order to make the description clearer, the widths, thicknesses, shapes and the like, of the respective parts are schematically illustrated in the drawings, compared to the actual modes. However, the schematic illustration is merely an example, and adds no restriction to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. The third direction Z is a normal to a plane including the first direction X and the second direction Y. In addition, viewing various elements parallel to the third direction Z is referred to as plan view.

When a position of an element located in a positive direction of the Z-axis a term such as “on” or “above” may be used, and when a position of an element located in its opposite direction a term such as “under” or “below” may be used. In addition, when a mutual relationship in position between two elements is defined by using terms such as “on”, “above”, “under”, “below”, and “oppose”, the relationship may imply not only a state in which the two elements are in direct contact with each other, but also a state in which the two elements are spaced apart from each other with a gap or the other element interposed therebetween.

The display device of each of the embodiments is an organic electroluminescent display device comprising an organic light emitting diode (OLED) as a display element, and can be mounted on televisions, personal computers, vehicle-mounted devices, tablet terminals, smartphones, cell phone terminals, and the like.

First Embodiment

FIG. 1 is a view showing a configuration example of a display device DSP according to a first embodiment. The display device DSP has a display area DA where images are displayed and a surrounding area SA around the display area DA, on an insulating first substrate 10. The first substrate 10 may be glass or a flexible resin film.

In the embodiment, the shape of the first substrate 10 in plan view is a rectangular shape. However, the shape of the first substrate 10 in plan view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. As an example, each pixel PX includes a red sub-pixel SP1, a green sub-pixel SP2, and a blue sub-pixel SP3. The pixel PX may include sub-pixels SP of the other color such as a white color together with the sub-pixels SP1, SP2, and SP3 or instead of any of the sub-pixels SP1, SP2, and SP3. The pixel PX may be composed of two sub-pixels SP or four or more sub-pixels SP.

The sub-pixel SP comprises a pixel circuit 1 and a display element DE driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element DE.

The display element DE is an organic light-emitting diode (OLED) serving as a light emitting element. For example, the sub-pixel SP1 comprises a display element DE that emits light of a red wavelength range, the sub-pixels SP2 comprises a display element DE that emits light of a green wavelength range, and the sub-pixels SP3 comprises a display element DE that emits light of a blue wavelength range.

The configuration of the pixel circuit 1 is not limited to the example shown in the figure. For example, the pixel circuit 1 may comprise more thin-film transistors and capacitors.

Figure 2:
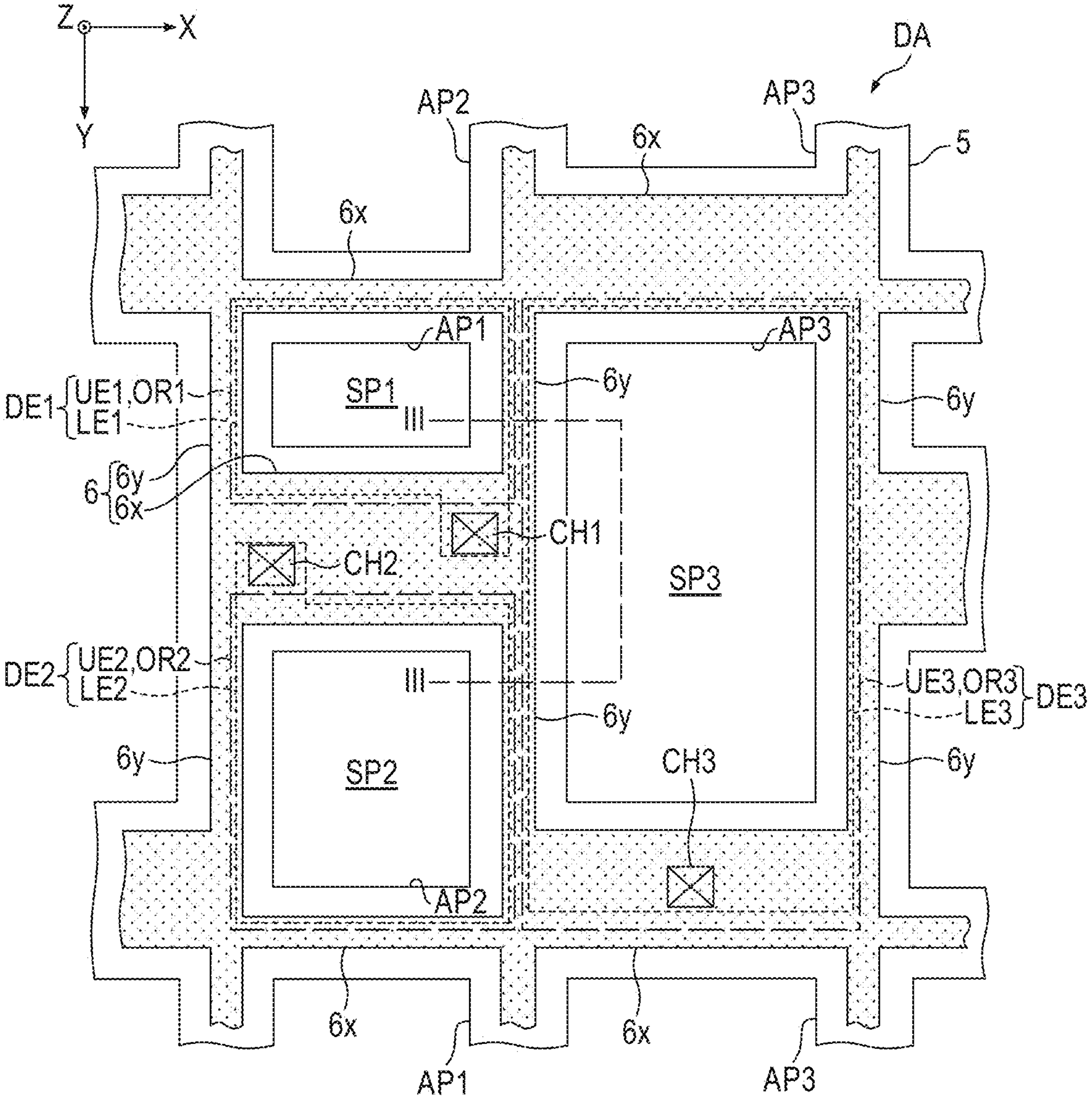
FIG. 2 is a diagram showing an example of the layout of sub-pixels.

FIG. 2 is a view showing an example of a layout of the sub-pixels SP1, SP2, and SP3. In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a row in which the sub-pixels SP1 and SP2 are alternately arranged in the second direction Y and a row in which a plurality of sub-pixels SP3 are repeatedly arranged in the second direction Y are formed in the display area DA. These rows are alternately arranged in the first direction X. The layout of the sub-pixels SP1, SP2, and SP3 is not limited to the example in FIG. 2.

A rib 5 and a partition 6 are arranged in the display area DA. The rib 5 includes pixel apertures AP1, AP2, and AP3 in the sub-pixels SP1, SP2, and SP3, respectively. In the example shown in FIG. 2, the pixel aperture AP2 is larger than the pixel aperture AP1, and the pixel aperture AP3 is larger than the pixel aperture AP2.

The partition 6 is provided on the boundary between adjacent sub-pixels SP and overlaps with the rib 5 in plan view. The partition 6 includes a plurality of first partitions 6*x* extending in the first direction X and a plurality of second partitions 6*y* extending in the second direction Y. The plurality of first partitions 6*x* are arranged between the pixel apertures AP1 and AP2 adjacent in the second direction Y and between two apertures AP3 adjacent in the second direction Y. The second partitions 6*y* are arranged between the pixel apertures AP1 and AP3 adjacent in the first direction X and between the pixel apertures AP2 and AP3 adjacent in the first direction X.

In the example in FIG. 2, the first partitions 6*x* and the second partitions 6*y* are connected to each other. Thus, the partition 6 has a grating pattern surrounding the pixel apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the pixel aperture AP1. The sub-pixel SP2 comprises a lower electrode LE2, an upper electrode UE2, and an organic layer OR2 each overlapping with the pixel aperture AP2. The sub-pixel SP3 comprises a lower electrode LE3, an upper electrode UE3, and an organic layer OR3 each overlapping with the pixel aperture AP3.

The lower electrode LE1, the upper electrode UE1, and the organic layer OR1 constitute a display element DE1 of the sub-pixel SP1. The lower electrode LE2, the upper electrode UE2, and the organic layer OR2 constitute a display element DE2 of the sub-pixel SP2. The lower electrode LE3, the upper electrode UE3, and the organic layer OR3 constitute a display element DE3 of the sub-pixel SP3. The display elements DE1, DE2, and DE3 may further include a cap layer to be described below.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

In the example shown in FIG. 2, the contact holes CH1 and CH2 entirely overlap with the first partition 6*x* between the pixel apertures AP1 and AP2 adjacent to each other in the second direction Y. The contact hole CH3 entirely overlaps with the first partition 6*x* between two apertures AP3 adjacent to each other in the second direction Y. As another example, at least part of the contact hole CH1, CH2 or CH3 may not overlap the first partition 6*x*.

Figure 3:
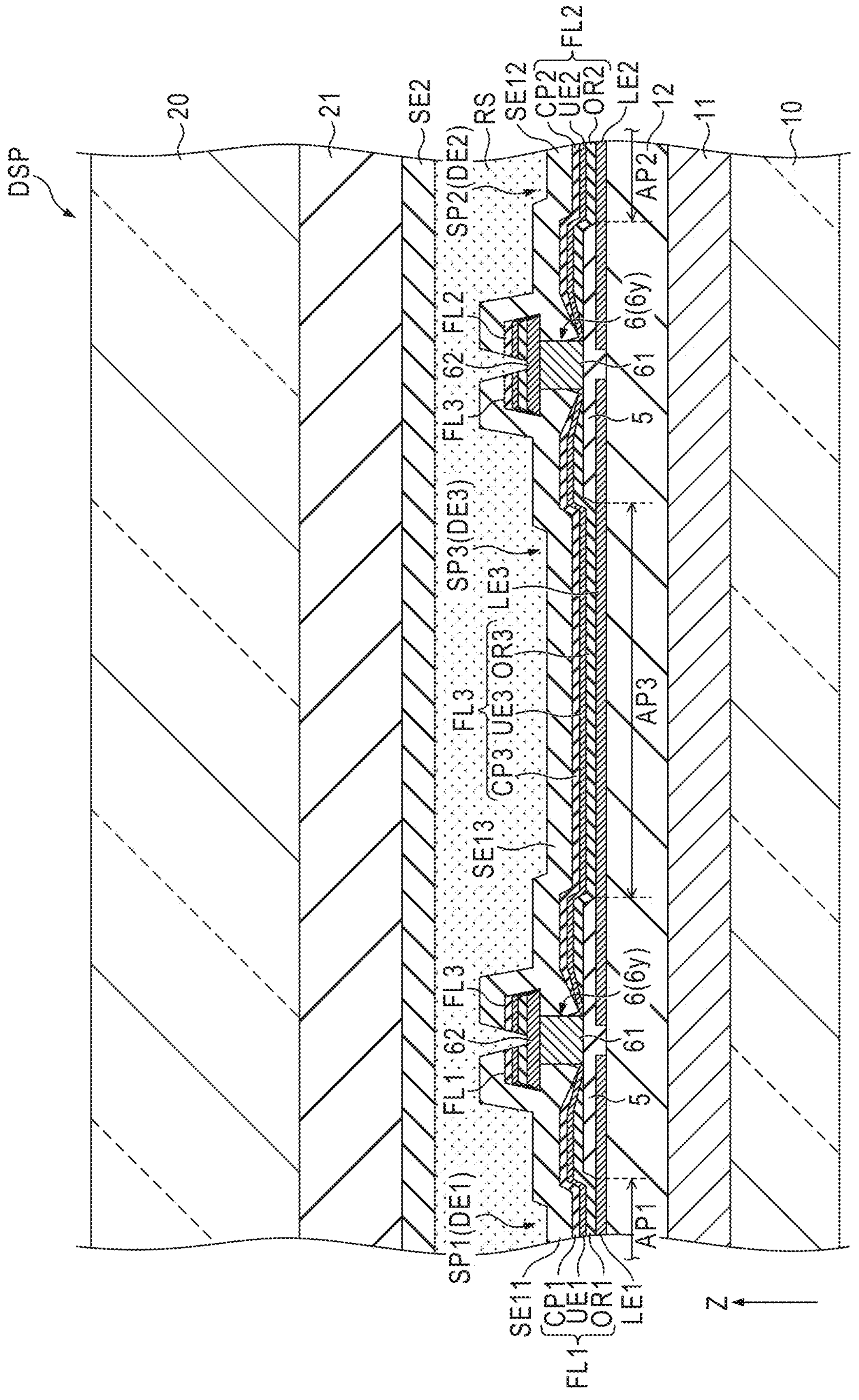
FIG. 3 is a schematic cross-sectional view showing the display device along line III-III in FIG. 2.

FIG. 3 is a schematic cross-sectional view showing the display device DSP along line III-III in FIG. 2. A circuit layer 11 is arranged on the above-described first substrate 10. The circuit layer 11 includes various circuits and lines such as the pixel circuits 1, the scanning lines GL, the signal lines SL and the power lines PL shown in FIG. 1.

The circuit layer 11 is covered with an organic insulating layer 12. The organic insulating layer 12 functions as a planarization film for planarizing uneven parts generated by the circuit layer 11. Although not shown in the cross-section of FIG. 3, the contact holes CH1, CH2, and CH3 are provided in the organic insulating layer 12.

The lower electrodes LE1, LE2, and LE3 are arranged on the organic insulating layer 12. The rib 5 is arranged on the organic insulating layer 12 and the lower electrodes LE1, LE2, and LE3. End parts of the lower electrodes LE1, LE2, and LE3 are covered with the rib 5.

The partition 6 includes a lower portion 61 which is arranged on the rib 5 and is conductive and an upper portion 62 which is arranged on the lower portion 61. The upper portion 62 has a width greater than the lower portion 61. As a result, both the end parts of the upper portion 62 protrude beyond the side surfaces of the lower portion 61 in FIG. 3. This shape of the partition 6 is referred to as overhanging.

The organic layer OR1 covers the lower electrode LE1 through the pixel aperture AP1. The upper electrode UE1 covers the organic layer OR1 and is opposed to the lower electrode LE1. The organic layer OR2 covers the lower electrode LE2 through the pixel aperture AP2. The upper electrode UE2 covers the organic layer OR2 and is opposed to the lower electrode LE2. The organic layer OR3 covers the lower electrode LE3 through the pixel aperture AP3. The upper electrode UE3 covers the organic layer OR3 and is opposed to the lower electrode LE3. At least parts of the upper electrodes UE1, UE2, and UE3 are in contact with the side surface of the lower portion 61.

In the example shown in FIG. 3, a cap layer CP1 is arranged on the upper electrode UE1, a cap layer CP2 is arranged on the upper electrode UE2, and a cap layer CP3 is arranged on the upper electrode UE3. The cap layers CP1, CP2, and CP3 adjust optical properties of the light emitted from the organic layers OR1, OR2, and OR3, respectively.

In the following descriptions, a stacked layer body including the organic layer OR1, the upper electrode UE1, and the cap layer CP1 is referred to as a thin film FL1, a stacked layer body including the organic layer OR2, the upper electrode UE2, and the cap layer CP2 is referred to as a thin film FL2, and a stacked layer body including the organic layer OR3, the upper electrode UE3, and the cap layer CP3 is referred to as a thin film FL3.

A part of the thin film FL1 is located on the upper portion 62. This part is separated from a portion of the thin film FL1 (i.e., a portion constituting the display element DE1), which is located under the partition 6. Similarly, a part of the thin film FL2 is located on the upper portion 62, and this part is separated from a portion of the thin film FL2 (i.e., a portion constituting the display element DE2), which is located under the partition 6. Furthermore, a part of the thin film FL3 is located on the upper portion 62, and this part is separated from a portion of the thin film FL3 (i.e., a portion constituting the display element DE3), which is located under the partition 6.

First sealing layers SE11, SE12, and SE13 are arranged in the sub-pixels SP1, SP2, and SP3, respectively. The first sealing layer SE11 continuously covers the thin film FL1, and the partition 6 around the sub-pixel SP1. The first sealing layer SE12 continuously covers the thin film FL2, and the partition 6 around the sub-pixel SP2. The first sealing layer SE13 continuously covers the thin film FL3, and the partition 6 around the sub-pixel SP3.

In the example shown in FIG. 3, the thin film FL1 and the first sealing layer SE11 on the partition 6 between the sub-pixels SP1 and SP3 are separated from the thin film FL3 and the first sealing layer SE13 on the partition 6. In addition, the thin film FL2 and the first sealing layer SE12 on the partition 6 between the sub-pixels SP2 and SP3 are separated from the thin film FL3 and the first sealing layer SE13 on the partition 6.

The first sealing layers SE11, SE12, and SE13 are covered with a resin layer RS. The resin layer RS is covered with a second sealing layer SE2. The resin layer RS and the second sealing layer SE2 are provided continuously on a whole body of at least the display area DA, and partially extend to the surrounding area SA.

The display device DSP further comprises a second substrate 20 facing the second sealing layer SE2. The second substrate 20 and the second sealing layer SE2 are adhered by a transparent adhesive layer 21. For example, optical clear adhesive (OCA) can be used as the adhesive layer 21.

For example, the second substrate 20 is an optical element such as a polarizer, a protective film, a cover glass, or a touch panel. The second substrate 20 may be a stacked layer body formed by adhering two or more types of elements different in function, such as an optical element, a protective film, a cover film, and a touch panel by adhesive layers.

The organic insulating layer 12 is formed of an organic insulating material. The rib 5, the first sealing layers SE11, SE12, and SE13, and the second sealing layer SE2 are formed of, for example, an inorganic insulating material such as silicon nitride (SiNx), silicon oxide (SiOx) or silicon oxynitride (SiON). The rib 5, the first sealing layers SE11, SE12, and SE13, and the second sealing layer SE2 may be a stacked layer body of different types of inorganic insulating materials. The resin layer RS is formed of, for example, a resin material (organic insulating material) such as acrylic resin.

The lower electrodes LE1, LE2, and LE3 include, for example, an intermediate layer formed of silver (Ag) and a pair of conductive oxide layers covering each of upper and lower surfaces of the intermediate layer. Each of the conductive oxide layers can be formed of, for example, a transparent conductive oxide such as indium tin oxide (ITO), indium zinc oxide (IZO), or indium gallium zinc oxide (IGZO).

The upper electrodes UE1, UE2, and UE3 are formed of, for example, a metal material such as an alloy (MgAg) of magnesium and silver. For example, the lower electrodes LE1, LE2, and LE3 correspond to anodes, and the upper electrodes UE1, UE2, and UE3 correspond to cathodes.

Each of the organic layers OR1, OR2, and OR3 includes a stacked layer structure of, for example, a hole-injection layer, a hole-transport layer, an electron blocking layer, a light emitting layer, a hole blocking layer, an electron-transport layer, and an electron-injection layer. The organic layers OR1, OR2, and OR3 may have a so-called tandem structure including a plurality of light emitting layers.

The cap layers CP1, CP2, and CP3 are formed of, for example, a multilayer body of a plurality of transparent thin films. As the plurality of thin films, the multilayer body may include a thin film formed of an inorganic material and a thin film formed of an organic material. In addition, these thin films have refractive indices different from each other. The materials of the thin films constituting the multilayer body are different from the materials of the upper electrodes UE1, UE2, and UE3 and are also different from the materials of the first sealing layers SE11, SE12, and SE13. At least one of the cap layers CP1, CP2, and CP3 may be omitted.

The lower portion 61 of the partition 6 is formed of, for example, aluminum (Al). The lower portion 61 may be formed of an aluminum alloy such as aluminum-neodymium (AlNd) or may have a multilayer structure of an aluminum layer and an aluminum alloy layer. Furthermore, the lower portion 61 may include a thin film formed of a metal material different from aluminum and an aluminum alloy, under the aluminum layer or the aluminum alloy layer. Such a thin layer can be formed of, for example, molybdenum (Mo).

The upper portion 62 of the partition 6 has, for example, a multilayer structure of a thin film formed of a metal material such as titanium (Ti) and a thin film formed of a conductive material such as ITO. The upper portion 62 may have a single-layer structure of a metal material such as titanium. In addition, the upper portion 62 may have a single-layer structure of an inorganic insulating material different from the first sealing layers SE11, SE12, and SE13.

A common voltage is supplied to the partition 6. This common voltage is supplied to each of the upper electrodes UE1, UE2, and UE3 that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the light emitting layer of the organic layer OR1 emits light of the red wavelength range. When a potential difference is formed between the lower electrode LE2 and the upper electrode UE2, the light emitting layer of the organic layer OR2 emits light of the green wavelength range. When a potential difference is formed between the lower electrode LE3 and the upper electrode UE3, the light emitting layer of the organic layer OR3 emits light of the blue wavelength range.

Figure 4:
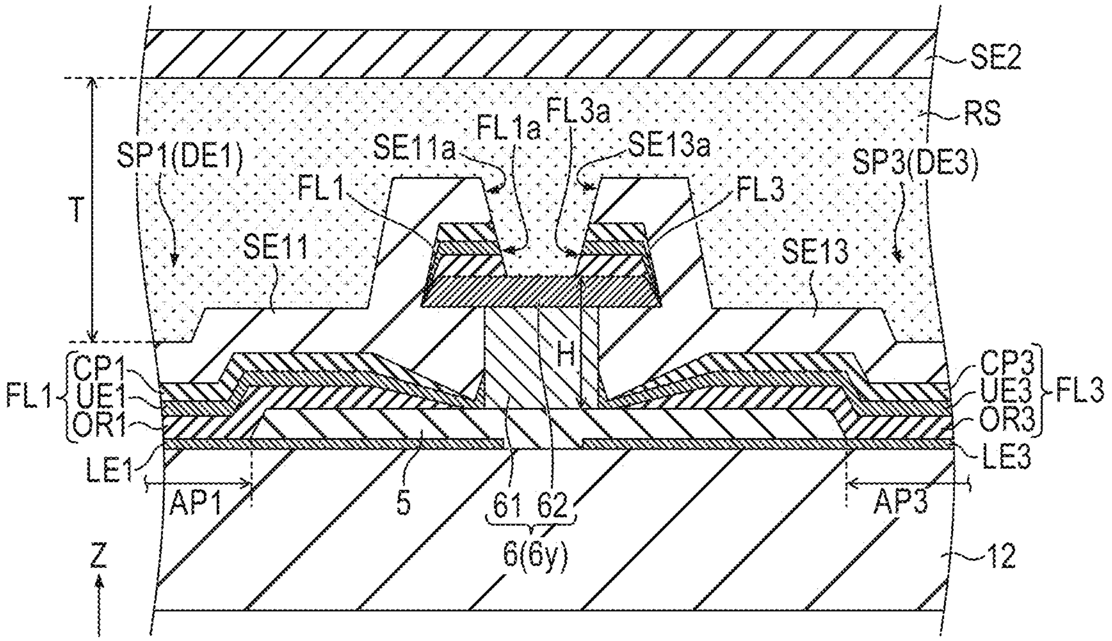
FIG. 4 is an enlarged cross-sectional view schematically showing a partition and its vicinity.

FIG. 4 is an expanded schematic cross-sectional view showing the partition 6 arranged on the boundary between the sub-pixels SP1 and SP3 and a vicinity of the partition 6. In this figure, the first substrate 10, the circuit layer 11, the second substrate 20, and the adhesive layer 21 are omitted.

The organic layer OR1, the upper electrode UE1, and the cap layer CP1 are formed by vapor deposition and are patterned together with the first sealing layer SE11. An end portion FL1*a* of the thin film FL1 including the organic layer OR1, the upper electrode UE1, and the cap layer CP1 is located on the upper portion 62. An end portion SE11*a* of the first sealing layer SE11 is also located on the upper portion 62. The end portion FL1*a* is not covered with the first sealing layer SE11.

Similarly, the organic layer OR3, the upper electrode UE3, and the cap layer CP3 are formed by vapor deposition and are patterned together with the first sealing layer SE13. An end portion FL3*a* of the thin film FL3 including the organic layer OR3, the upper electrode UE3, and the cap layer CP3 is located on the upper portion 62. An end portion SE13*a* of the first sealing layer SE13 is also located on the upper portion 62. The end portion FL3*a* is not covered with the first sealing layer SE13.

The end portion FL1*a* and the end portion FL3*a* are spaced apart via a gap. The end portion SE11*a* and the end portion SE13*a* are spaced apart via a gap. The resin layer RS is continuously provided on the entire display area DA to cover the end portions FL1*a*, FL3*a*, SE11*a*, and SE13*a*. Furthermore, the resin layer RS fills the gap between the end portion FL1*a* and the end portion FL3*a* and the gap between the end portion SE11*a* and the end portion SE13*a*, and is in contact with the upper portion 62.

The configuration of the partition 6 between the sub-pixels SP1 and SP2 and its vicinity, and the configuration of the partition 6 between the sub-pixels SP2 and SP3 and its vicinity are the same as the example shown in FIG. 4.

The resin layer RS planarizes uneven parts generated by the partition 6, the thin films FL1, FL2, and FL3, and the first sealing layers SE11, SE12, and SE13. A thickness T of the resin layer RS is larger than a height H of the partition 6 (T>H). From the viewpoint of planarization, the thickness T is desirably twice or more as large as the height H. In contrast, from the viewpoint of thinning the display device DSP, the thickness T is desirably five or less times as large as the height T, and is more desirably three or less times as large as the height T. As an example, the height H is 1 μm and the thickness T is 2 to 3 μm.

Next, a structure which can be applied to the surrounding area SA will be described.

Figure 5:
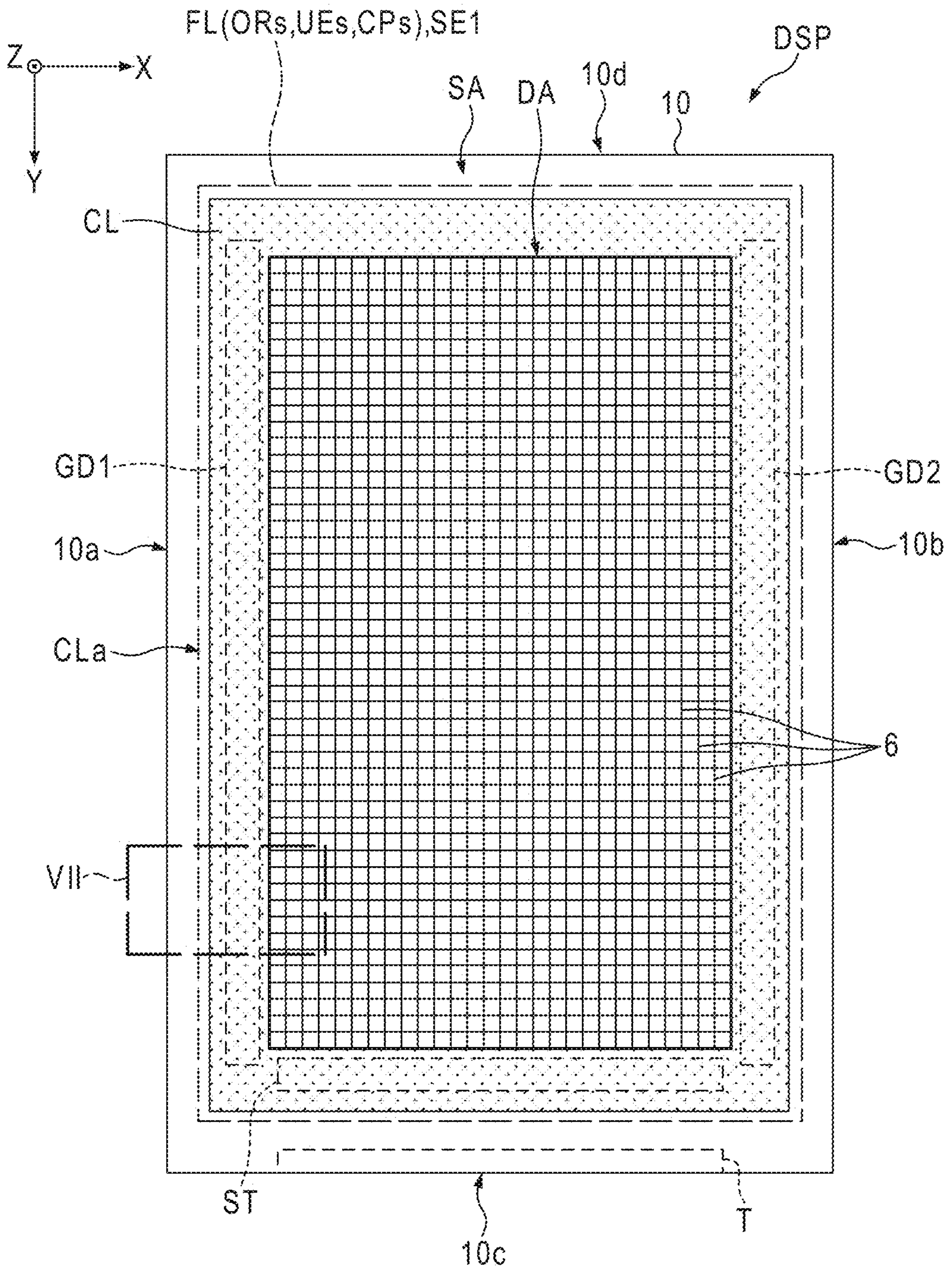
FIG. 5 is a schematic plan view showing the display device according to the first embodiment.

FIG. 5 is a schematic plan view showing the display device DSP. The display device DSP comprises a first gate drive circuit GD1, a second gate drive circuit GD2, a selector circuit ST, and a terminal portion T as elements arranged in the surrounding area SA. The first gate drive circuit GD1, the second gate drive circuit GD2, and the selector circuit ST are examples of drive circuits which supply signals to the pixel circuits 1, and are included in the circuit layer 11 shown in FIG. 3.

The first gate drive circuit GD1 and the second gate drive circuit GD2 supply scanning signals to the scanning lines G shown in FIG. 1. For example, a flexible printed circuit is connected to the terminal portion T. The selector circuit ST supplies a video signal input from the flexible printed circuit to the signal line SL shown in FIG. 1.

The first substrate 10 has end portions 10*a*, 10*b*, 10*c*, and 10*d*. The end portions 10*a* and 10*b* extend parallel to the second direction Y. The end portions 10*c* and 10*d* extend parallel to the first direction X.

In the example of FIG. 5, the first gate drive circuit GD1 is provided between the display area DA and the end portion 10*a*, the second gate drive circuit GD2 is arranged between the display area DA and the end portion 10*b*, and the selector circuit ST and the terminal portion T are arranged between the display area DA and the end portion 10*c*.

Furthermore, the display device DSP comprises a conductive layer CL (i.e., a portion with a dot pattern) arranged in the surrounding area SA. In the example of FIG. 5, the conductive layer CL surrounds the display area DA.

The conductive layer CL is connected to the partition 6 arranged in the display area DA. The conductive layer CL overlaps with the first gate drive circuit GD1, the second gate drive circuit GD2, and the selector circuit ST in plan view.

The conductive layer CL may not necessarily have a shape surrounding the display area DA. For example, the conductive layer CL may not be arranged between the display area DA and the end portion 10*c* or between the display area DA and the end portion 10*d*.

An organic layer ORs, an upper electrode UEs, a cap layer CPs, and the first sealing layer SE1 are arranged in the surrounding area SA. The organic layer ORs is formed of the same material by the same process as one of the organic layers OR1, OR2, and OR3. The upper electrode UEs is formed of the same material by the same process as one of the upper electrodes UE1, UE2, and UE3. The cap layer CPs is formed of the same material by the same process as one of the cap layers CP1, CP2, and CP3. The first sealing layer SE1 is formed of the same material by the same process as one of the sealing layers SE11, SE12, and SE13. As an example, the organic layer ORs, the upper electrode UEs, the cap layer CPs, and the first sealing layer SE1 are formed of the same materials by the same processes as the organic layer OR3, the upper electrode UE3, the cap layer CP3, and the first sealing layer SE13, respectively.

A stacked layer body including the organic layer ORs, the upper electrode UEs, and the cap layer CPs is referred to as a thin film FL in the following descriptions. The thin film FL and the first sealing layer SE1 overlap with the conductive layer CL in plan view.

Figure 6:
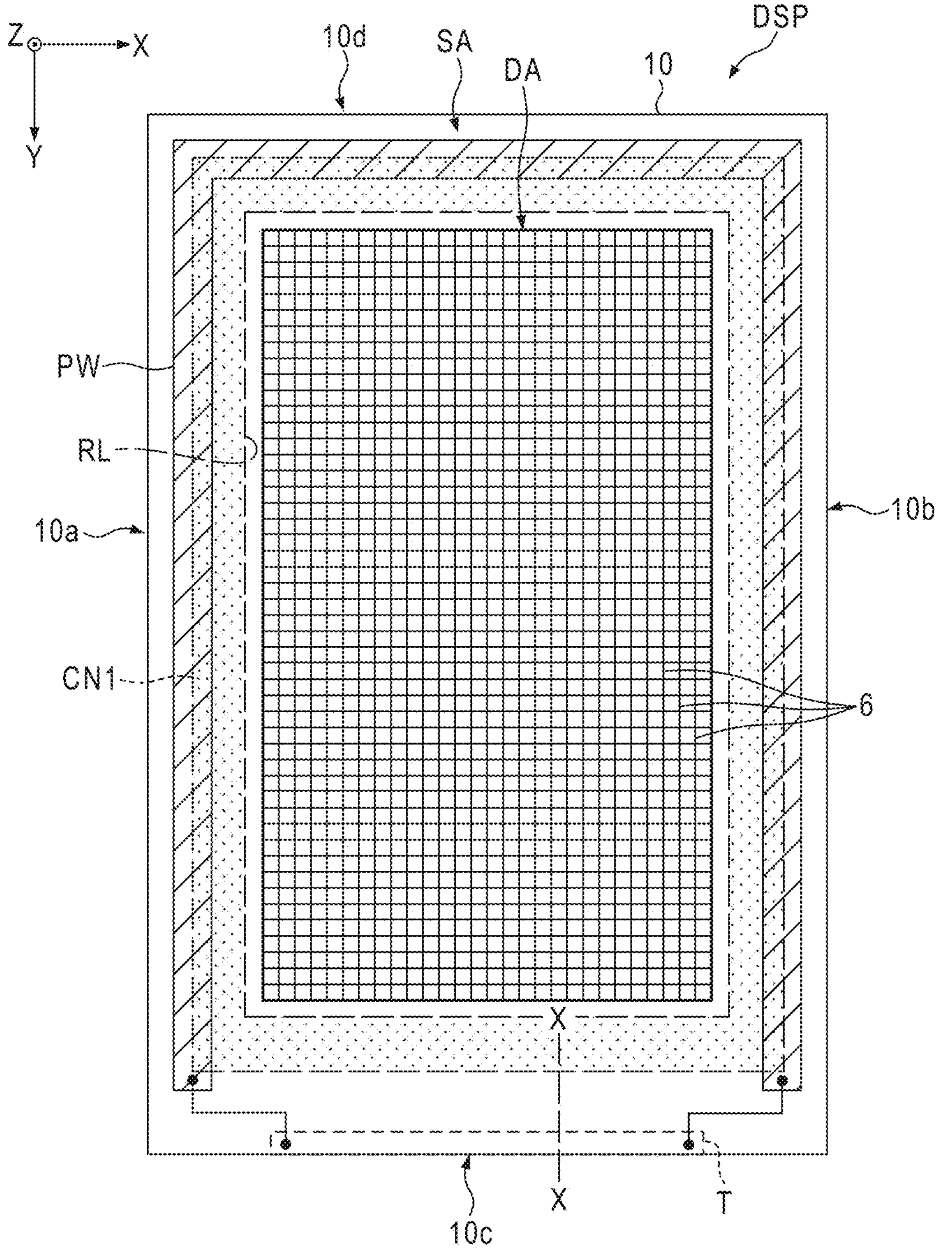
FIG. 6 is a schematic plan view showing the other elements of the display device according to the first embodiment.

FIG. 6 is a schematic plan view showing the other elements arranged in the surrounding area SA. A power supply line PW (i.e., a portion with an oblique line pattern) and a relay wire RL (a portion with a dot pattern) are arranged in the surrounding area SA.

In the example of FIG. 6, the relay wire RL surrounds the display area DA. The power supply line PW extends between the display area DA and the end portions 10*a*, 10*b*, and 10*d*, but is not arranged between the display area DA and the end portion 10*c*. In the other example, the power supply line PW may surround the display area DA.

The power supply line PW and the relay wire RL overlap partially. The power supply line PW is electrically connected to the terminal portion T. A common voltage is supplied to the power supply line PW via the terminal portion T. Furthermore, the common voltage of the power supply line PW is supplied to the relay wire RL.

Figure 7:
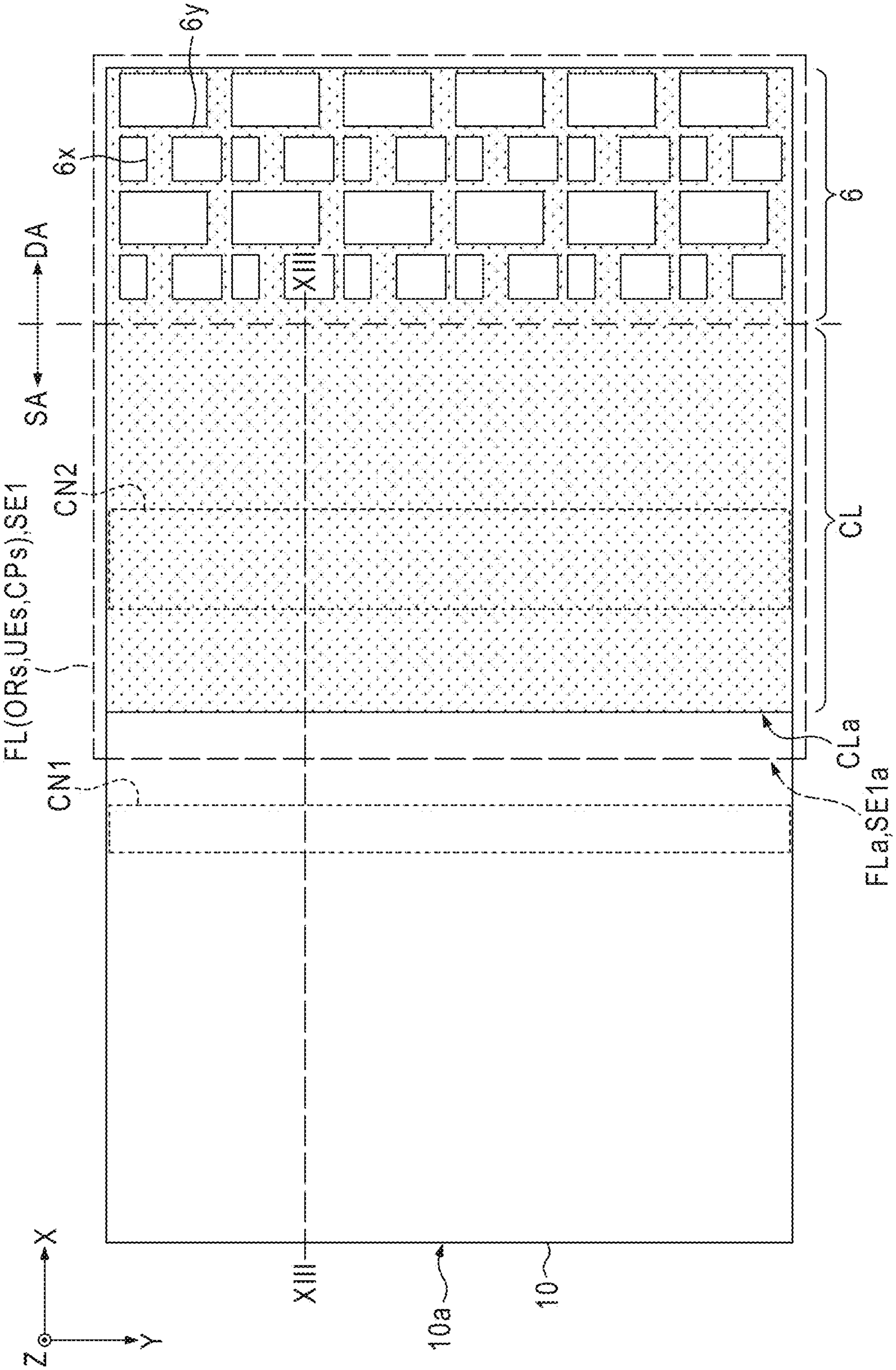
FIG. 7 is an enlarged view showing an area surrounded by dashed line frame VII in FIG. 5.
Figure 8:
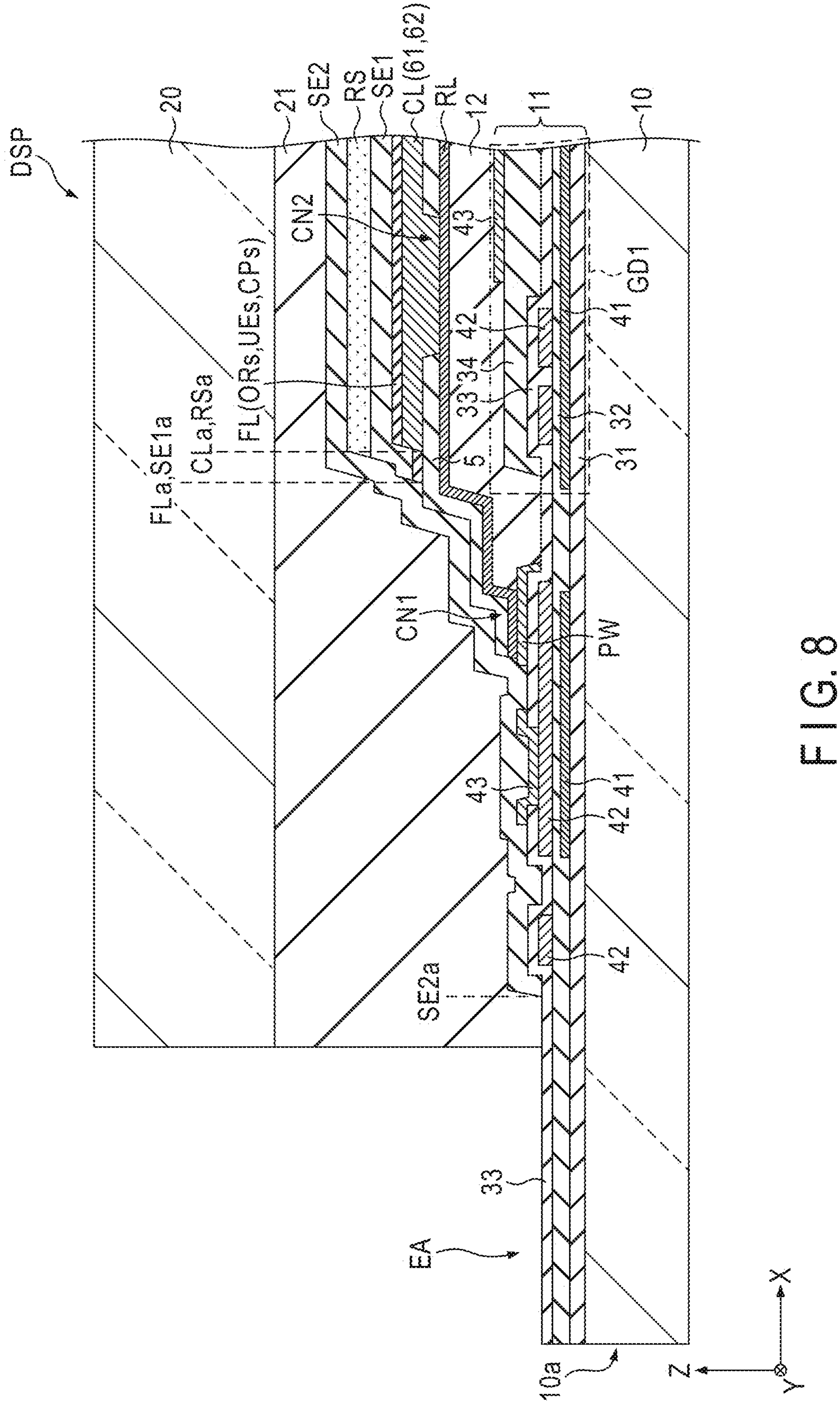
FIG. 8 is a schematic cross-sectional view showing the display device along line XIII-XIII in FIG. 7.

FIG. 7 is an enlarged view showing an area surrounded by dashed line frame VII in FIG. 5. FIG. 8 is a schematic cross-sectional view showing the display device DSP along line XIII-XIII in FIG. 7. In FIG. 7, an area with a dot pattern corresponds to the conductive layer CL and the partition 6 (i.e., first partitions 6*x* and second partitions 6*y*). The conductive layer CL and the partition 6 are integrally formed of the same material by the same manufacturing process.

In the example of FIG. 8, the circuit layer 11 comprises inorganic insulating layers 31, 32, and 33, an organic insulating layer 34, and metal layers 41, 42, and 43. The inorganic insulating layer 31 covers the first substrate 10. The metal layer 41 is provided on the inorganic insulating layer 31 and is covered with the inorganic insulating layer 32. The metal layer 42 is provided on the inorganic insulating layer 31 and is covered with the inorganic insulating layer 33. The organic insulating layer 34 is arranged on the inorganic insulating layer 33. The metal layer 43 is arranged on the organic insulating layer 34 and is covered with the organic insulating layer 12.

The inorganic insulating layers 31, 32, and 33 are formed of, for example, an inorganic material such as silicon nitride or silicon oxide. The metal layers 41, 42, and 43 have, for example, a single-layer structure or stacked layer structure of metal materials such as molybdenum (Mo), tungsten (W), molybdenum tungsten alloy (MoW), aluminum (Al), and copper (Cu).

The first gate drive circuit GD1 is formed by the metal layers 41, 42, and 43 and a semiconductor layer. The second gate drive circuit GD2 and the selector circuit ST shown in FIG. 5, and the pixel circuit 1 shown in FIG. 1 also consist of the metal layers 41, 42, and 43 and a semiconductor layer in the same manner. In addition, the scanning line GL shown in FIG. 1 is formed by the metal layer 41, and the signal line SL shown in FIG. 1 is formed by the metal layer 42.

The configuration of the circuit layer 11 is not limited to the example shown in FIG. 8. For example, the circuit layer 11 may comprise more inorganic insulating layers and more metal layers. In addition, the circuit layer 11 may not comprise the organic insulating layer 34.

The conductive layer CL covers the rib 5 in the surrounding area SA. The conductive layer CL includes the lower portion 61 and the upper portion 62 similarly to the partition 6 shown in FIGS. 3 and FIG. 4.

A most part of the relay wire RL is arranged on the organic insulating layer 12 and is covered with the rib 5. For example, the relay wire RL is formed of the same material by the same manufacturing process as the lower electrodes LE1, LE2, and LE3.

The relay wire RL is connected to the power supply line PW at a first contact portion CN1, and is connected to the conductive layer CL at a second contact portion CN2. The common voltage of the power supply line PW is thereby supplied to the conductive layer CL via the relay wire RL. Furthermore, the common voltage of the conductive layer CL is supplied to the partition 6 and the upper electrodes UE1, UE2, and UE3 in the display area DA.

The relay wire RL is in contact with the power supply line PW, at the first contact portion CN1. The first contact portion CN1 corresponds to, for example, the area where the power supply line PW overlaps with the relay wire RL in the plan view of FIG. 6. In the example of FIG. 8, the power supply line PW is constituted by the metal layer 43. The power supply line PW may be constituted by the metal layer 41 or the metal layer 42 or two or more of the metal layers 41, 42, and 43.

As shown in FIG. 8, the rib 5 is formed in an aperture, at the second contact portion CN2. The conductive layer CL is in contact with the relay wire RL through the aperture. The aperture of the rib 5 may extend over an entire area of the second contact portion CN2 shown in FIG. 7. Alternatively, a plurality of apertures may be provided to be dispersed in the rib 5, at the second contact portion CN2.

As shown in FIG. 7, the second contact portion CN2 is located between the first contact portion CN1 and the display area DA in plan view. An end portion CLa of the conductive layer CL is located between the first contact portion CN1 and the second contact portion CN2 in plan view.

In FIG. 7, an area where the thin film FL and the first sealing layer SE1 are arranged is represented by a dashed line. In addition, the thin film FL is shown as one layer in FIG. 8. In fact, the upper electrode UEs covers the organic layer ORs, and the cap layer CPs covers the upper electrode UEs, in the thin film FL. The first sealing layer SE1 covers the thin film FL.

As shown in FIG. 8, the thin film FL covers the conductive layer CL. As shown in FIG. 7, positions of the end portion FLa of the thin film FL and the end portion SE1*a* of the first sealing layer SE1 in plan view substantially correspond to each other. The end portions FLa and SE1*a* are located between the end portion CLa of the conductive layer CL and the first contact portion CN1.

As shown in FIG. 8, the resin layer RS and the second sealing layer SE2 are also formed in the surrounding area SA. For example, an end portion RSa of the resin layer RS is located more closely to the display area DA side than to the end portion FLa of the thin film FL and the end portion SE1*a* of the first sealing layer SE1. In the example of FIG. 8, the end portion RSa is located in the vicinity of the end portion CLa of the conductive layer CL, but is not limited to this.

The second sealing layer SE2 covers the whole resin layer RS. An end portion SE2*a* of the second sealing layer SE2 is located between the first contact portion CN1 and the end portion 10*a* of the first substrate 10. The second sealing layer SE2 is in contact with the first sealing layer SE1, the rib 5, the inorganic insulating layer 33, and the like in the surrounding area SA. The end portion RSa of the resin layer RS is covered with the first sealing layer SE1 and the second sealing layer SE2.

The first substrate 10 has an exposed area EA which does not face the second substrate 20, in the vicinity of the end portion 10*a*. The exposed area EA is not covered with the adhesive layer 21. In the example of FIG. 8, the second sealing layer SE2 does not extend to the exposed area EA.

The end portion SE2*a* of the second sealing layer SE2 is covered with the adhesive layer 21.

Figure 9:
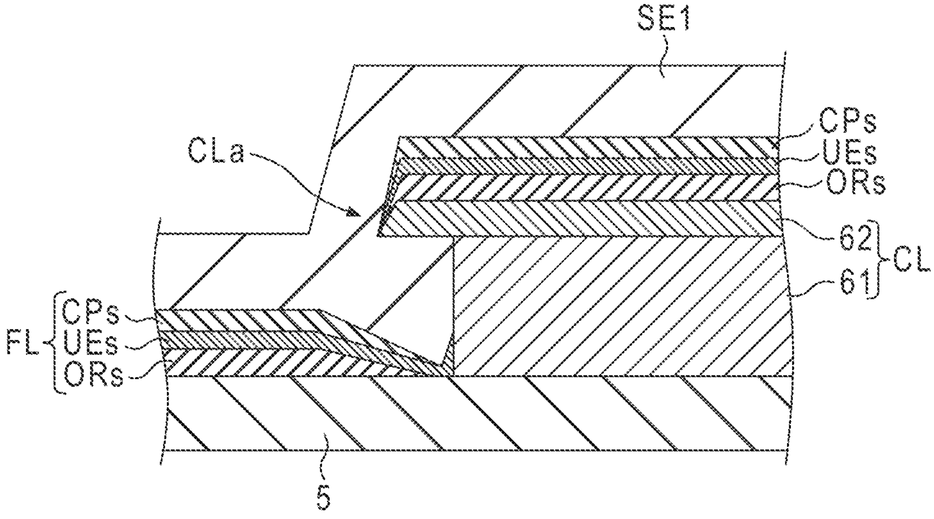
FIG. 9 is a schematic cross-sectional view showing a vicinity of an end portion of a conductive layer shown in FIG. 8.

FIG. 9 is a schematic cross-sectional view showing the vicinity of the end portion CLa of the conductive layer CL. The conductive layer CL includes the lower portion 61 and the upper portion 62 similarly to the partition 6 shown in FIG. 4. At the end portion CLa, the upper portion 62 further protrudes than a side surface of the lower portion 61. In addition, the shape of the conductive layer CL at the end portion CLa is an overhung state similarly to the partition 6.

When the thin film FL (organic layer ORs, upper electrode UEs, and cap layer CPs) is formed on the conductive layer CL having such a shape, the thin film FL is divided at the end portion CLa as shown in FIG. 9. The first sealing layer SE1 covers the thin films FL located on and under the conductive layer CL, and also covers the side surface of the lower portion 61.

Incidentally, the structure between the display area DA and the end portion 10*a* of the first substrate 10 has been focused in FIG. 7 and FIG. 8, but the same structure can also be applied between the display area DA and the end portion 10*b* and between the display area DA and the end portion 10*d*.

Figure 10:
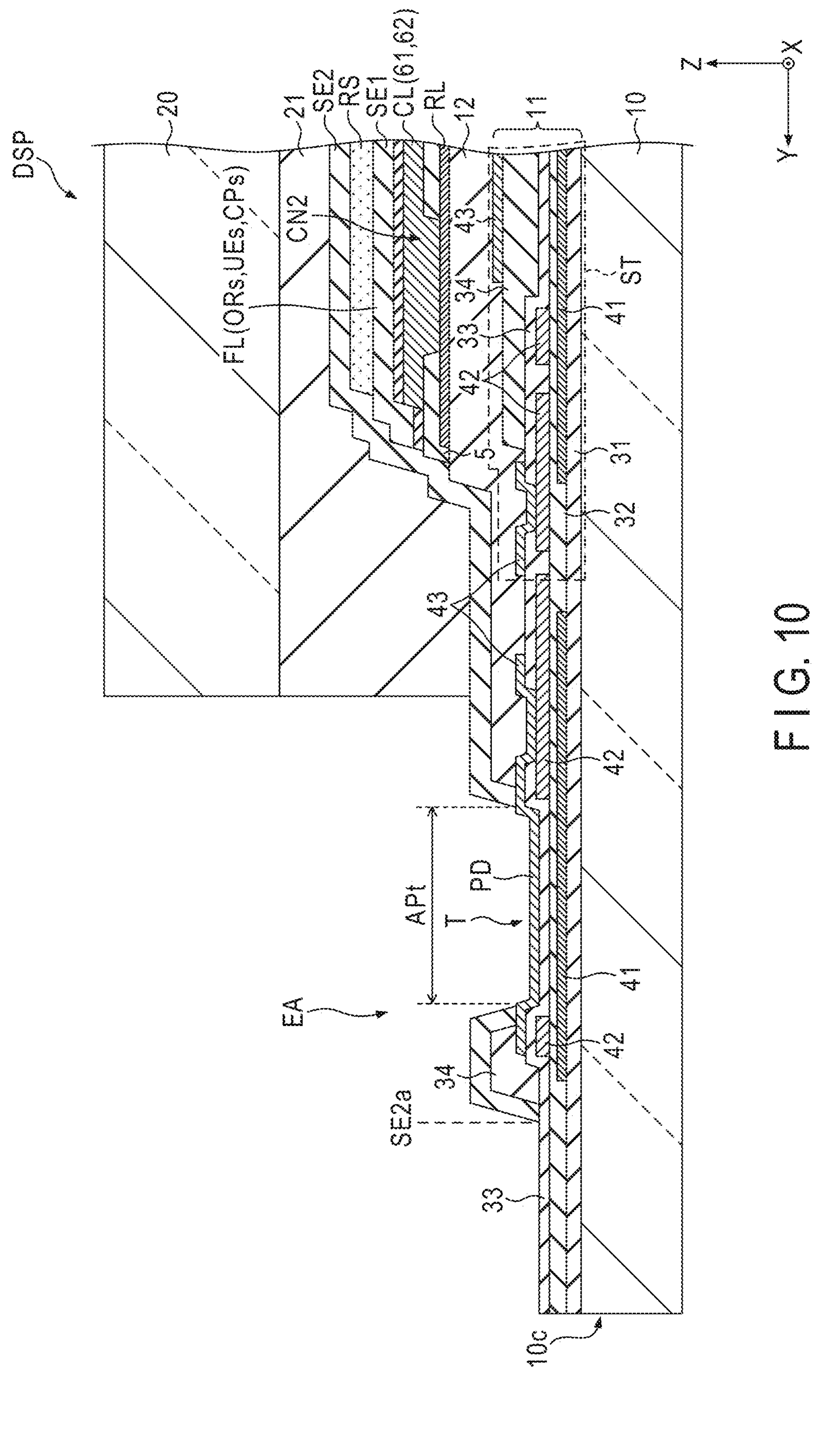
FIG. 10 is a schematic cross-sectional view showing the display device along line X-X in FIG. 6.

FIG. 10 is a schematic cross-sectional view showing the display device DSP along line X-X in FIG. 6. The terminal portion T comprises a pad PD. The pad PD is formed by, for example, the metal layer 43.

An edge of the pad PD is covered with the organic insulating layer 12 and the second sealing layer SE2. In other words, the pad PD is located between the first substrate 10 and the second sealing layer SE2 in the third direction Z. The pad PD is exposed from the organic insulating layer 12 and the second sealing layer SE2 through an aperture APt which penetrates the organic insulating layer 12 and the second sealing layer SE2.

A plurality of pads PD having such a configuration are arranged along the first direction X, at the terminal portion T. For example, the plurality of pads PD are connected to a wire to supply the video signal to the selector circuit ST, a wire to supply the common voltage to the power supply line PW, a wire to supply the power voltage to the power line PL, and the like.

The terminal portion T is provided in the exposed area EA. In other words, the pads PD are exposed from the adhesive layer 21. The pads PD are connected to, for example, a flexible printed circuit via a conductive adhesive.

In the manufacturing of the display device DSP, first, the circuit layer 11 including the pixel circuit 1, the gate drive circuits GD1 and GD2, the selector circuit ST, the power supply line PW, and the terminal portion T is formed on the first substrate 10. After the formation of the circuit layer 11, the organic insulating layer 12 is formed on the circuit layer 11.

After that, the lower electrodes LE1, LE2, and LE3 shown in FIG. 3, and the relay wire RL shown in FIG. 8 are formed, and the rib 5 is formed on these components. Furthermore, the partition 6 and the conductive layer CL are formed.

Next, the thin film FL1 including the organic layer OR1, the upper electrode UE1, and the cap layer CP1, and the first sealing layer SE11 are formed in the sub-pixel SP1, the thin film FL2 including the organic layer OR2, the upper electrode UE2, and the cap layer CP2, and the first sealing layer SE12 are formed in the sub-pixel SP2, and the thin film FL3 including the organic layer OR3, the upper electrode UE3, and the cap layer CP3, and the first sealing layer SE13 are formed in the sub-pixel SP3. The order of forming the thin films FL1, FL2, and FL3 is not particularly limited but, for example, the thin film FL3 is first formed, then the thin film FL2 is formed, and the thin film FL1 is finally formed.

The layers (organic layer, upper electrode, and cap layer) constituting the thin films FL1, FL2, and FL3 are formed by, for example, vapor deposition. The first sealing layers SE1, SE11, SE12, and SE13 are formed by, for example, chemical vapor deposition (CVD).

The thin film FL (organic layer ORs, upper electrode UEs, and cap layer CPs) and the first sealing layer SE1 shown in FIG. 8 to FIG. 10 can be formed of the same material by the same process as, for example, the thin film FL3 and the first sealing layer SE13. The thin films FL and FL3, and the first sealing layers SE1 and SE13 are patterned by the same photolithographic process. For this reason, as shown in FIG. 8 and FIG. 10, the end portion FLa of the thin film FL and the end portion SE1*a* of the first sealing layer SE1 are aligned.

After the formation of the thin film FL and the first sealing layer SE1, the resin layer RS is formed. The resin layer RS is formed by, for example, printing but may be formed in the other methods such as ink-jet method. From the viewpoint of suppressing expansion to the surrounding, the viscosity of the resin layer RS to be cured is desirably increased. The printing is suitable for the formation of such a resin layer RS having a high viscosity.

After the formation of the resin layer RS, the second sealing layer SE2 is formed. The second sealing layer SE2 is first formed on the entire first substrate 10, and patterned by the photolithographic process. The aperture APt is formed by the photolithographic process. After that, the second substrate 20 is adhered by the adhesive layer 21, and the flexible printed circuit is connected to the terminal portion T.

In the above embodiment, the thin films FL1, FL2, and FL3 arranged in the display area DA are individually sealed by the partition 6 and the first sealing layers SE11, SE12, and SE13. Furthermore, the resin layer RS covers the first sealing layers SE11, SE12, and SE13, and the second sealing layer SE2 covers the resin layer RS. In such a configuration, entry of moisture into the thin films FL1, FL2, and FL3 and, further, entry of moisture into the resin layer RS on the thin films can be suitably suppressed, and the display device DSP excellent in resistance to moisture can be obtained.

Moreover, in the embodiment, the second sealing layer SE2 and the second substrate 20 are adhered by the adhesive layer 21. As the sealing structure of the organic EL display device, a structure of covering the display device with a plurality of resin layers and a plurality of inorganic insulating layers can be employed but, in this case, the thickness of the display device DSP is increased. In contrast, according to the structure of the embodiment, the thickness of the display device DSP can be reduced while increasing the resistance to moisture.

The second sealing layer SE2 is formed in the entire display area DA, and formed in a most part of the surrounding area SA. Since the second sealing layer SE2 formed of an inorganic material is thus in contact with the adhesive layer 21, the first substrate 10 and the second substrate 20 can be adhered desirably.

In the embodiment, the end portion FLa of the thin film FL arranged in the surrounding area SA is covered with the second sealing layer SE2. Entry of moisture into the peripheral circuits through the thin film FL can be thereby suppressed.

Furthermore, in the embodiment, the thin film FL is divided by the end portion CLa of the conductive layer CL as shown in FIG. 9. Entry of moisture through the thin film FL is thereby suppressed certainly. The configuration disclosed in the embodiment can be modified in various aspects. Several modified examples will be described below.

Figure 11:
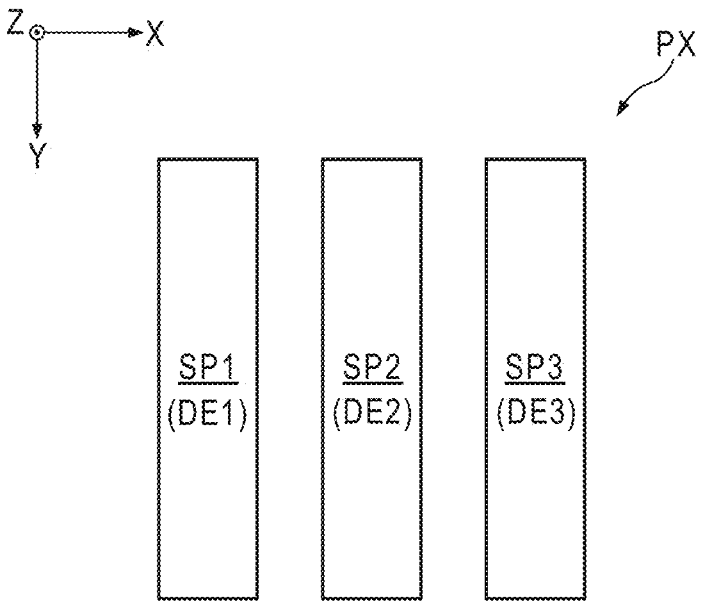
FIG. 11 is a schematic plan view showing a pixel according to a first modified example.

FIG. 11 is a schematic plan view showing the pixel PX according to a first modified example. In this example, the sub-pixels SP1, SP2, and SP3 constituting the pixel PX are arranged in the first direction X. When the pixels PX are arrayed in a matrix, a row including a plurality of sub-pixels SP1 that are continuous in the second direction Y, a row including a plurality of sub-pixels SP2 that are continuous in the second direction Y, and a row including a plurality of sub-pixels SP3 that are continuous in the second direction Y, are formed in the display area DA.

Figure 12:
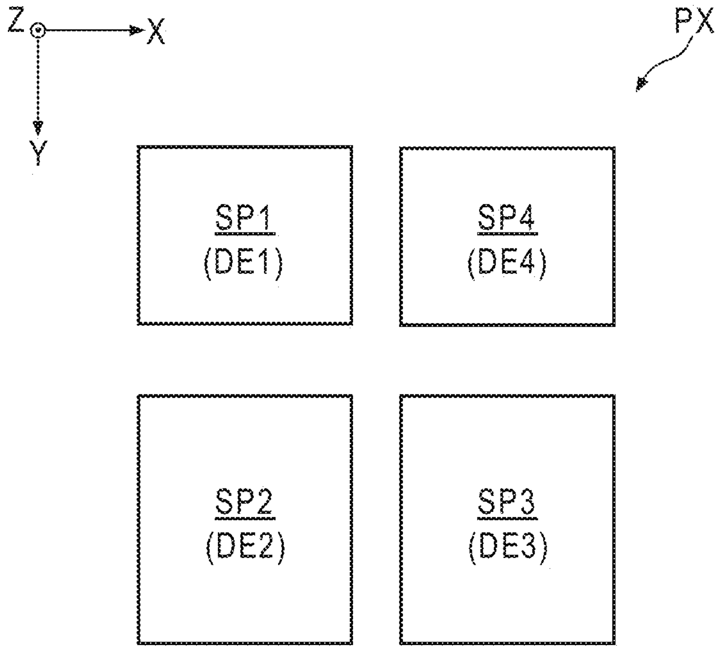
FIG. 12 is a schematic plan view showing the pixel according to a second modified example.

FIG. 12 is a schematic plan view showing the pixel PX according to a second modified example. In this example, the PX includes a white sub-pixel SP4 in addition to the sub-pixels SP1, SP2, and SP3. The sub-pixel SP4 includes a display element DE4 emitting white light. The color of the emitted light from the sub-pixel SP4 may be other colors.

In FIG. 12, the sub-pixel SP1 and the sub-pixel SP4 are arranged in the first direction X, and the sub-pixel SP2 and the sub-pixel SP3 are arranged in the first direction X. In addition, the sub-pixel SP1 and the sub-pixel SP2 are arranged in the second direction Y, and the sub-pixel SP3 and the sub-pixel SP4 are arranged in the second direction Y.

Figure 13:
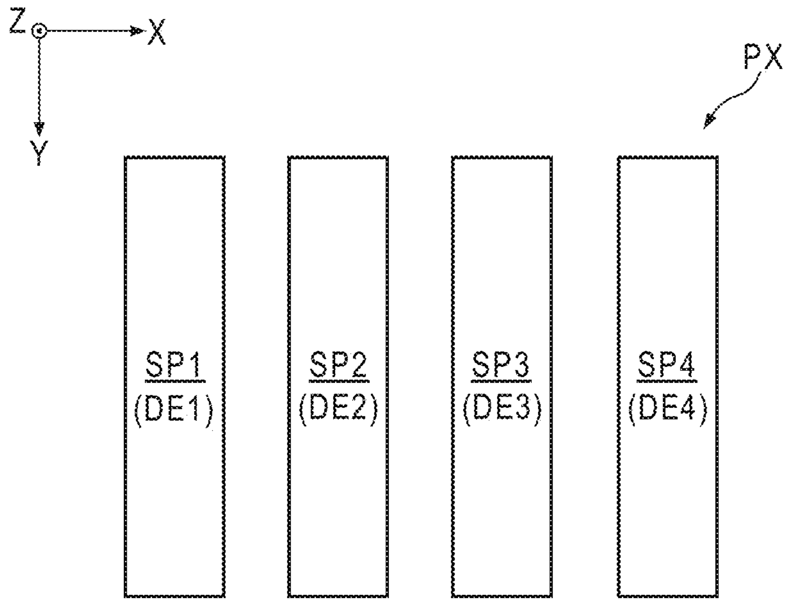
FIG. 13 is a schematic plan view showing the pixel according to a third modified example.

FIG. 13 is a schematic plan view showing the pixel PX according to a third modified example. In this example, the pixel PX includes the sub-pixels SP1, SP2, SP3, and SP4 similarly to the second modified example. However, the sub-pixels SP1, SP2, SP3, and SP4 are arranged in the first direction X. When the pixels PX are arrayed in a matrix, a row including a plurality of sub-pixels SP1 that are continuous in the second direction Y, a row including a plurality of sub-pixels SP2 that are continuous in the second direction Y, a row including a plurality of sub-pixels SP3 that are continuous in the second direction Y, and a row including a plurality of sub-pixels SP4 that are continuous in the second direction Y, are formed in the display area DA.

Figure 14:
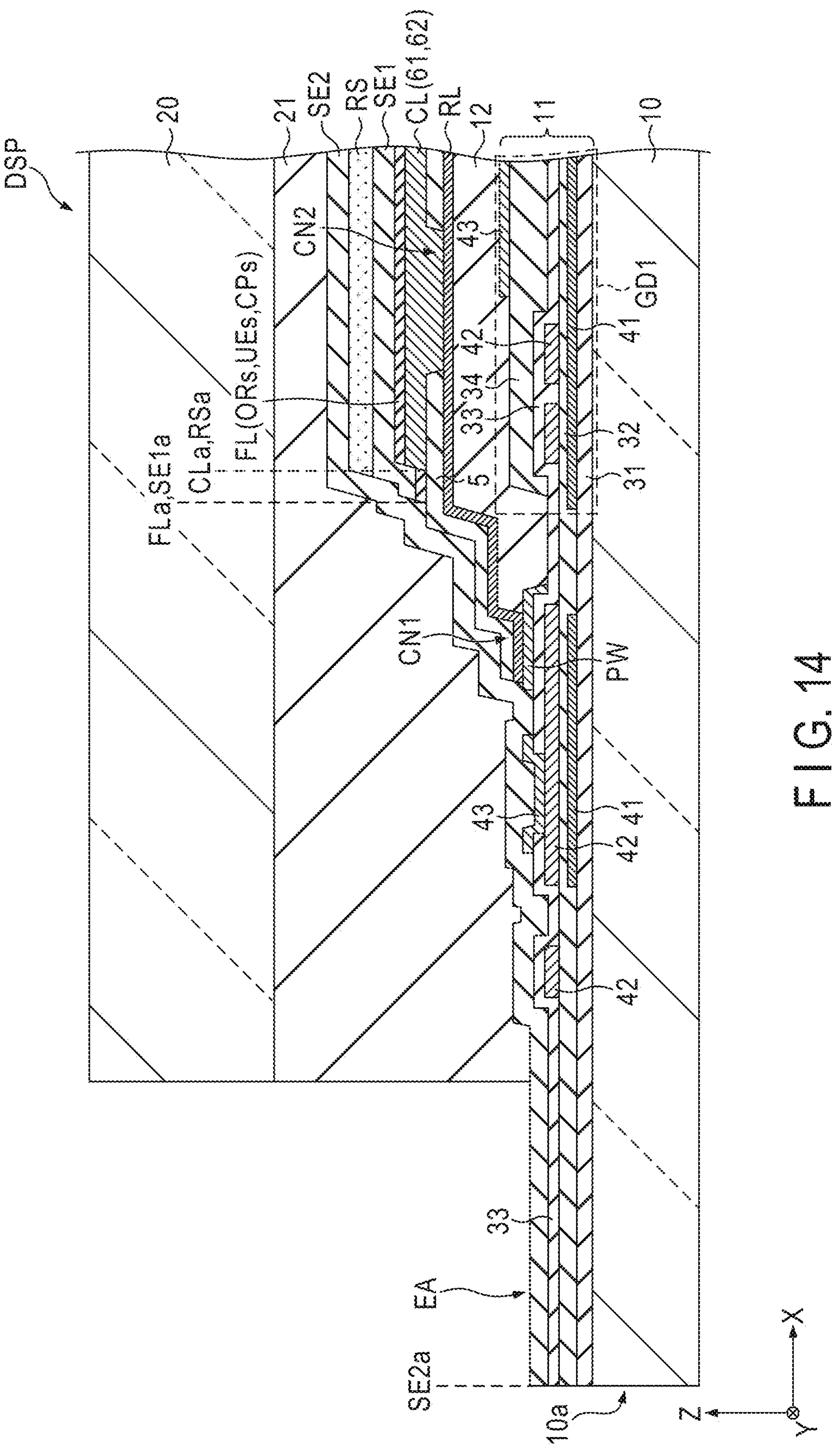
FIG. 14 is a schematic cross-sectional view showing the display device according to a fourth modified example.

FIG. 14 is a schematic cross-sectional view showing the display device DSP according to a fourth modified example. In this example, the second sealing layer SE2 is formed on the entire first substrate 10. In other words, the end portion SE2*a* of the second sealing layer SE2 corresponds to the end portions 10*a*, 10*b*, 10*c*, and 10*d* of the first substrate 10 in plan view.

The configurations according to the above-described first to fourth modified examples can be combined arbitrarily. In addition, the configurations according to the first to fourth modified examples can also be applied to a second embodiment to be described later.

Second Embodiment

A second embodiment will be described. Configurations which are not particularly mentioned are the same as those of the first embodiment.

Figure 15:
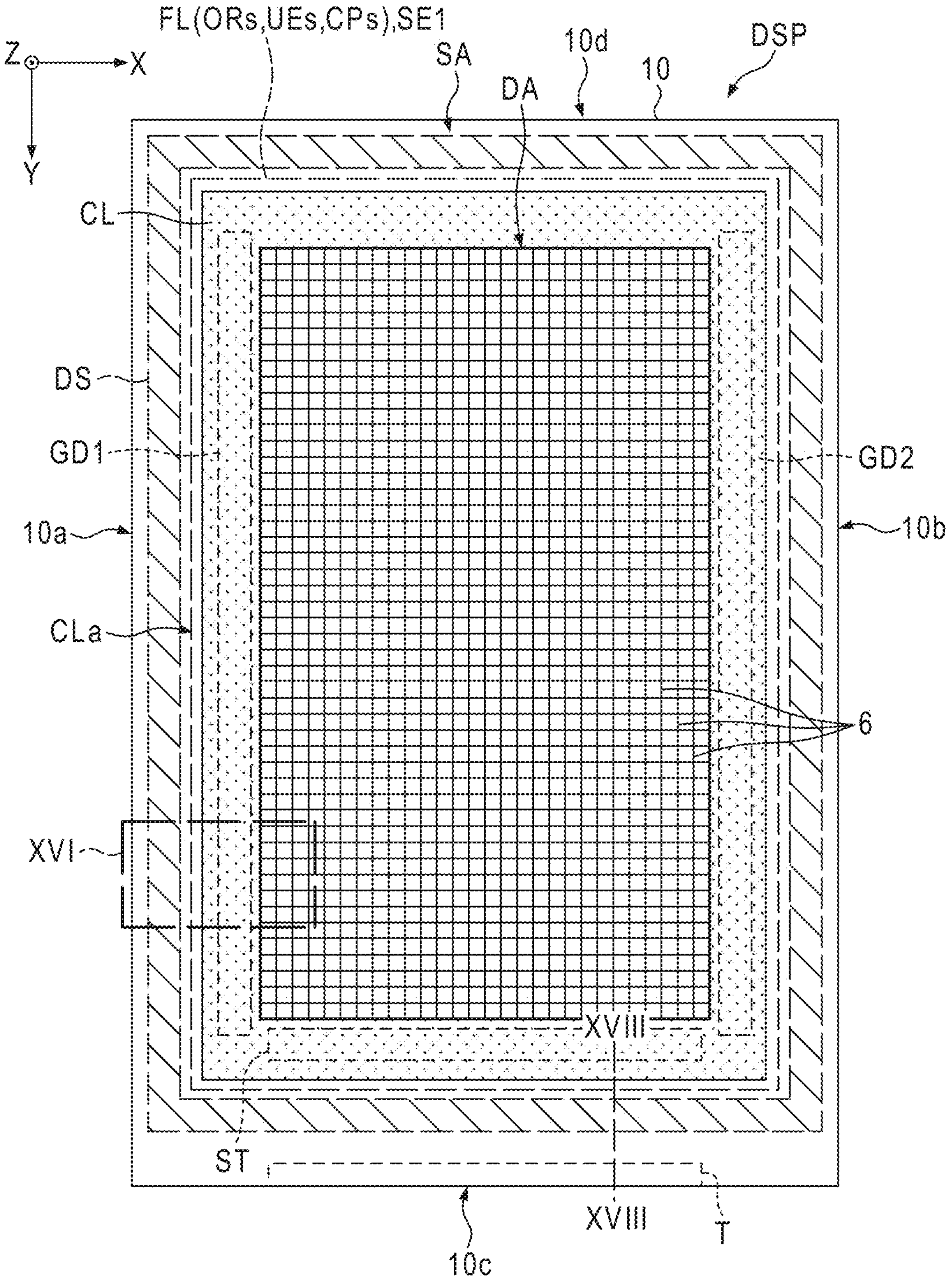
FIG. 15 is a schematic plan view showing a display device according to a second embodiment.

FIG. 15 is a schematic plan view showing a display device DSP according to the second embodiment. In the embodiment, the display device DSP further comprises a dam structure DS arranged in a surrounding area SA. In the example of FIG. 15, the dam structure DS surrounds a display area DA and a conductive layer CL. For example, the dam structure DS plays a role of blocking a resin layer RS.

Figure 16:
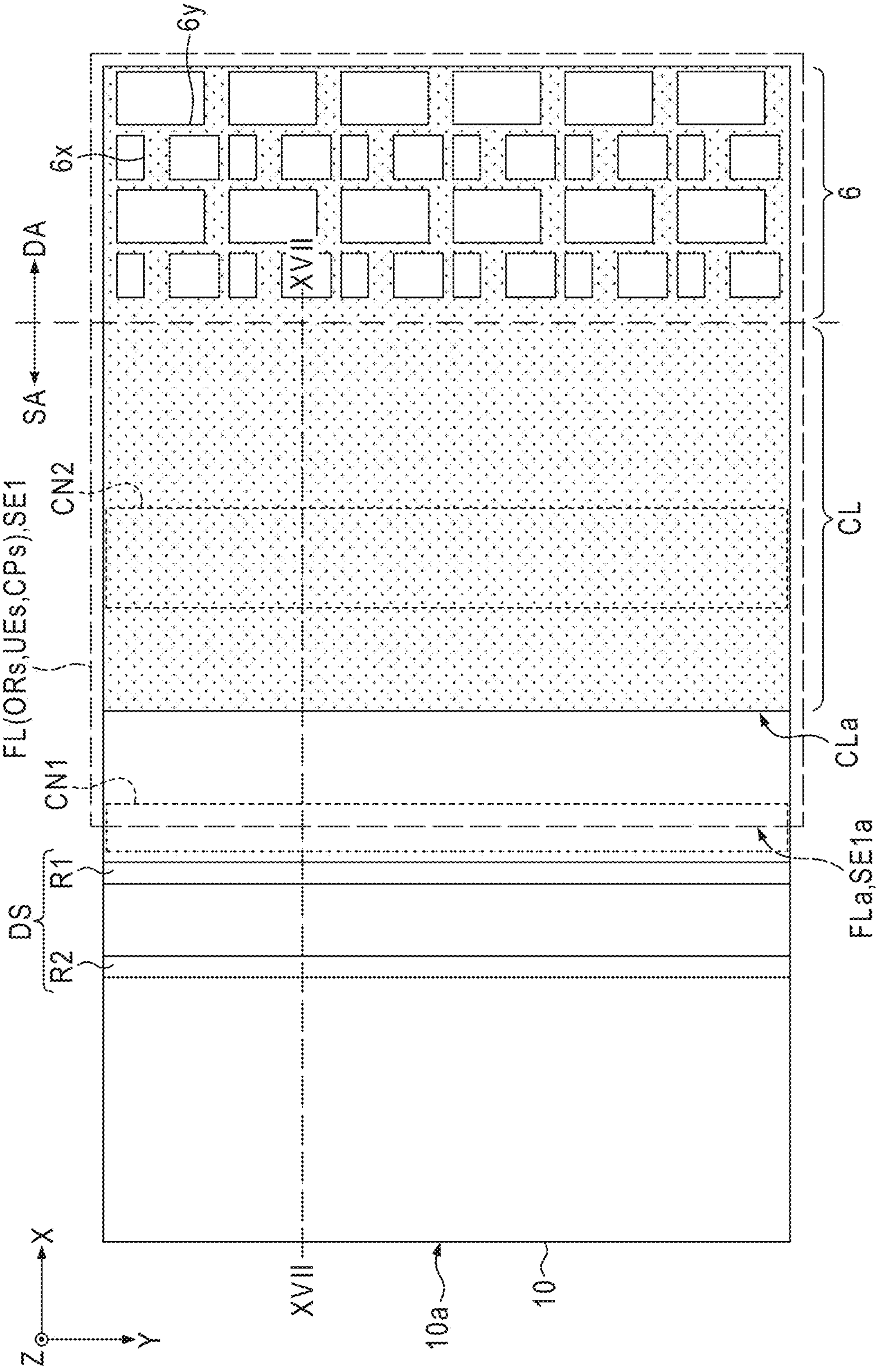
FIG. 16 is an enlarged view showing an area surrounded by dashed line frame XVI in FIG. 15.
Figure 17:
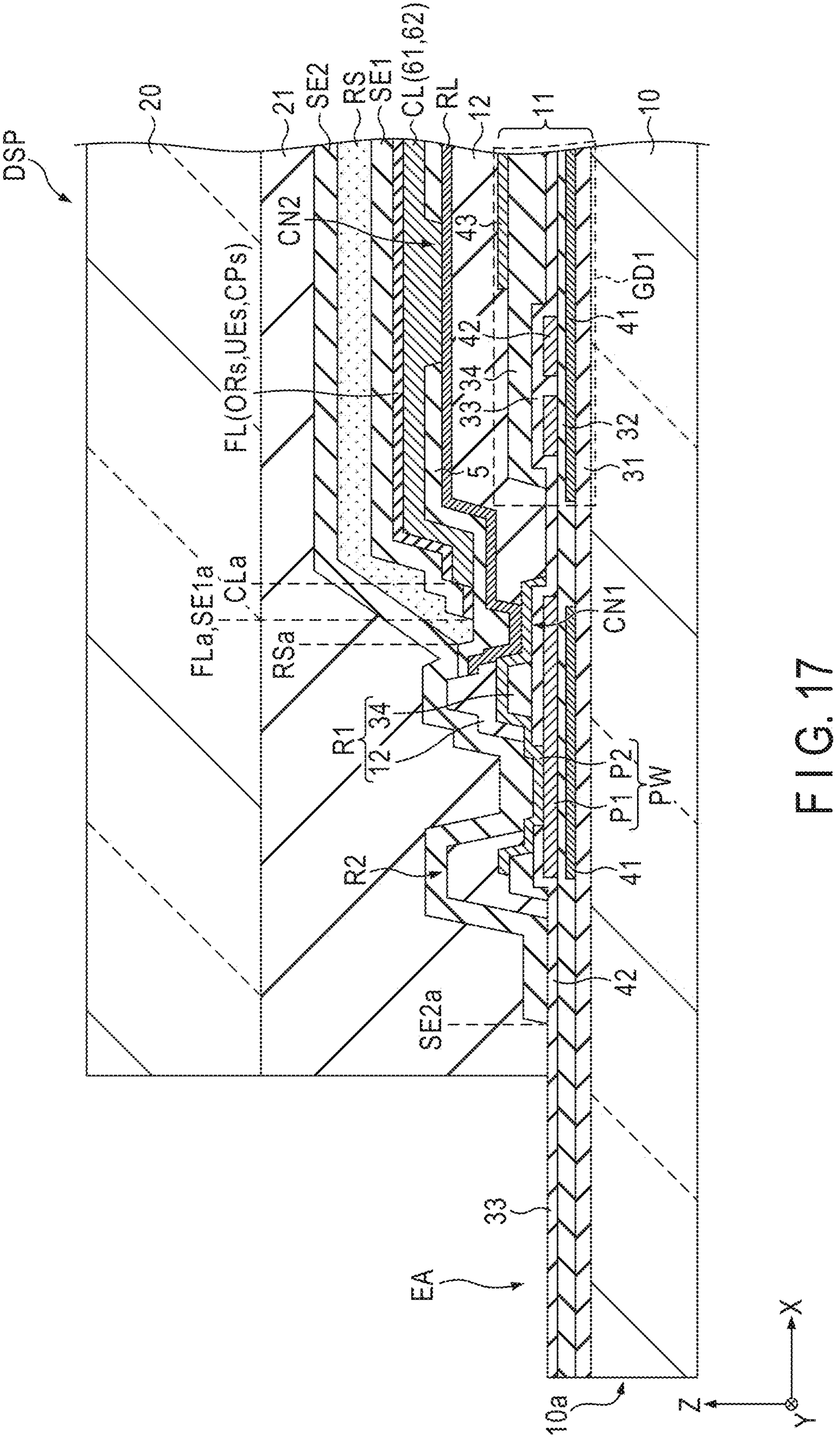
FIG. 17 is a schematic cross-sectional view showing the display device along line XVII-XVII in FIG. 16.
Figure 18:
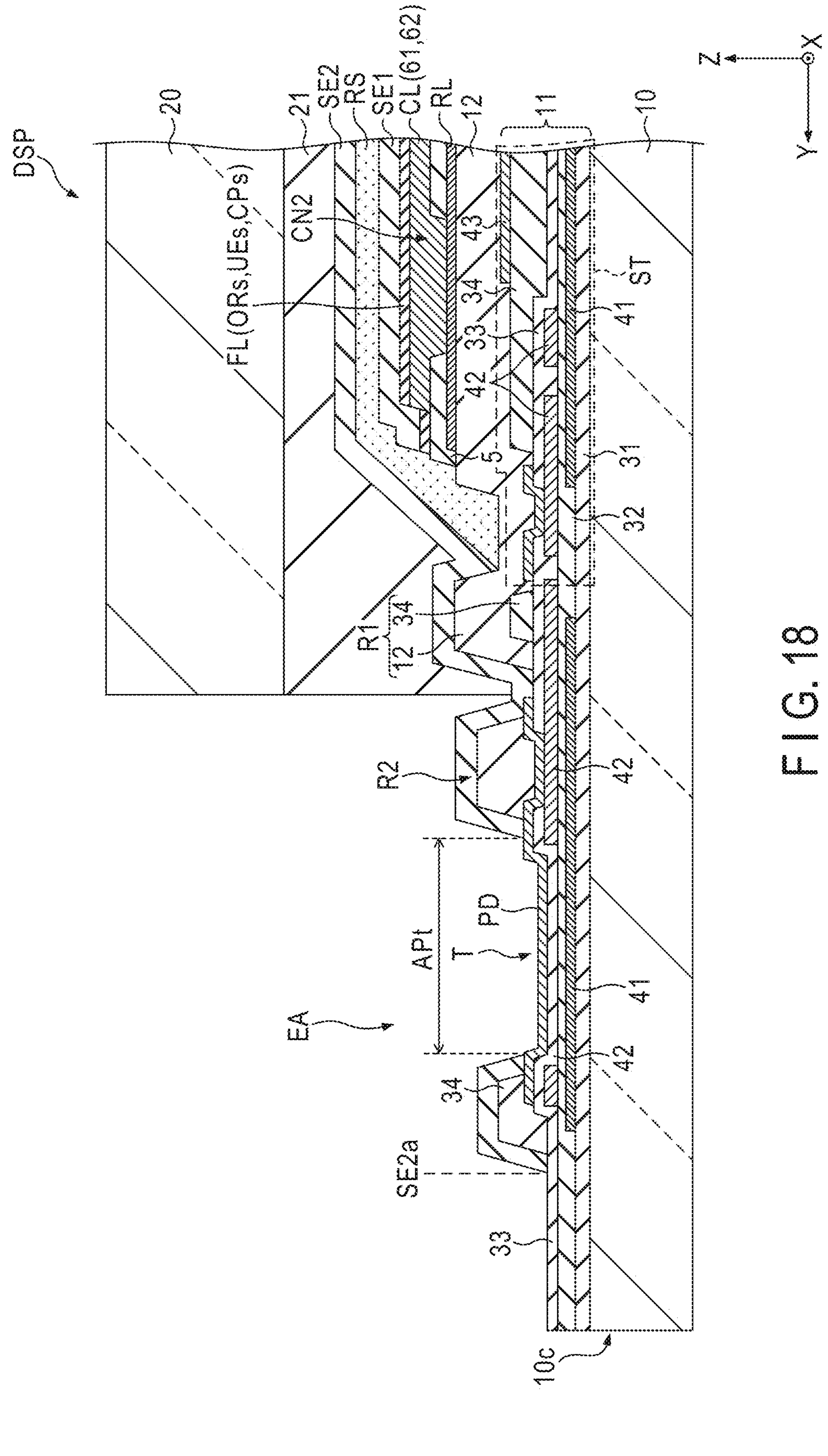
FIG. 18 is a schematic cross-sectional view showing the display device along line XVIII-XVIII in FIG. 15.

FIG. 16 is an enlarged view showing an area surrounded by dashed line frame XVI in FIG. 15. FIG. 17 is a schematic cross-sectional view showing the display device DSP along line XVII-XVII in FIG. 16. FIG. 18 is a schematic cross-sectional view showing the display device DSP along line XVIII-XVIII in FIG. 15.

As shown in FIG. 16, the dam structure DS includes protruding portions R1 and R2 (i.e., a first protruding portion and a second protruding portion). For example, the protruding portions R1 and R2 are shaped in a frame formed along a planar shape of the dam structure DS shown in FIG. 15. In other words, the protruding portion R1 surrounds the display area DA, and the protruding portion R2 surrounds the protruding portion R1. The number of protruding portions included in the dam structure DS is not limited to two, but may be one or three or more.

The protruding portions R1 and R2 are located between a first contact portion CN1 and an end portion 10*a* of a first substrate 10. An end portion FLa of a thin film FL and an end portion SE1*a* of a first sealing layer SE1 are located between an end portion CLa of a conductive layer CL and the protruding portion R1.

In the example of FIG. 17, the protruding portion R1 includes a portion formed by an organic insulating layer 34 and a portion formed by an organic insulating layer 12. The portion formed by the organic insulating layer 12 covers the portion formed by the organic insulating layer 34. The protruding portion R2 is configured similarly to the protruding portion R1. By thus forming the protruding portions R1 and R2 of two organic insulating layers, the height of the protruding portions R1 and R2 can be increased as compared to a case of forming the protruding portions of one organic insulating layer.

In the example of FIG. 17, a power supply line PW includes a first portion P1 formed by a metal layer 42, and a second portion P2 formed by a metal layer 43. The second portion P2 is in contact with the first portion P1.

The first portion P1 is located under the organic insulating layer 34 of the protruding portion R1. The second portion P2 is located on the organic insulating layer 34 of the protruding portion R1 and is covered with the organic insulating layer 12. In other words, the organic insulating layer 34 of the protruding portion R1 is located between the first portion P1 and the second portion P2, in a third direction Z (i.e., a thickness direction of the first substrate 10 or a normal of the first substrate 10). The first contact portion CN1 is provided in the vicinity of the protruding portion R1. A relay wire RL is in contact with the second portion P2 of the power supply line PW, at the first contact portion CN1.

The second sealing layer SE2 covers at least a part of the dam structure DS. More specifically, the second sealing layer SE2 covers the protruding portions R1 and R2 in the example of FIG. 17. Portions of the second sealing layer SE2 which cover the protruding portions R1 and R2 are covered with the adhesive layer 21. The second sealing layer SE2 is in contact with portions of the organic insulating layer 12 of the protruding portions R1 and R2 and the second portion P2 of the power supply line PW, which are located between the protruding portions R1 and R2, and a portion of the inorganic insulating layer 33, which is located between the protruding portion R2 and the end portion 10*a* of the first substrate 10.

Incidentally, the structure between the display area DA and the end portion 10*a* of the first substrate 10 has been focused in FIG. 17, but the same structure can also be applied between the display area DA and the end portion 10*b* and between the display area DA and the end portion 10*d*.

As shown in FIG. 18, the protruding portions R1 and R2 are arranged more closely to the display device DSP side than to the pad PD. In other words, the protruding portion R1 is located between the pad PD and the display area DA in plan view, and the protruding portion R2 is located between the pad PD and the protruding portion R1 in plan view. In the cross-section of FIG. 18, a portion of the second sealing layer SE2 which covers the protruding portion R1 is covered with the adhesive layer 21. In contrast, a portion of the second sealing layer SE2 which covers the protruding portion R2 is not covered with the adhesive layer 21. In addition, in the cross-section of FIG. 18, the protruding portion R2 does not include the organic insulating layer 34. In the other example, the protruding portion R2 may include the organic insulating layer 34, similarly to the cross-section of FIG. 17.

In the embodiment, the dam structure DS is arranged in the surrounding area SA. Since the resin layer RS to be cured is blocked by the dam structure DS, a position of the end portion RSa of the resin layer RS can be controlled with a good accuracy.

When the display device DSP has the dam structure DS, a resin layer RS having a low viscosity may be used. In this case, the resin layer RS can be formed by an ink-jet method.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:

a first substrate;

a lower electrode arranged above the first substrate, in a display area including a pixel;

a rib including a pixel aperture overlapping with the lower electrode;

a partition arranged on the rib in the display area;

an organic layer which covers the lower electrode through the pixel aperture and which emits light in accordance with application of a voltage;

an upper electrode covering the organic layer;

a first sealing layer formed of an inorganic material to continuously cover a thin film including the organic layer and the upper electrode, and the partition;

a resin layer covering the first sealing layer;

a second sealing layer formed of an inorganic material to cover the resin layer;

a second substrate facing the second sealing layer;

an adhesive layer adhering the second sealing layer and the second substrate; and a conductive layer arranged in a surrounding area around the display area, connected to the partition, and covered with the thin film, wherein each of the partition and the conductive layer includes a conductive lower portion and an upper portion which protrudes from a side surface of the lower portion.

2. The display device of claim 1, wherein end portions of the thin film and the first sealing layer are located above the partition and covered with the resin layer.

3. The display device of claim 1, wherein a thickness of the resin layer is five or less times as large as a height of the partition.

4. The display device of claim 3, wherein the thickness of the resin layer is larger than the height of the partition.

5. The display device of claim 1, wherein an end portion of the resin layer is located in the surrounding area and is covered with the second sealing layer.

6. The display device of claim 5, wherein an end portion of the second sealing layer is located in the surrounding area and covered with the adhesive layer.

7. The display device of claim 1, wherein the thin film is divided by an end portion of the conductive layer.

8. The display device of claim 1, further comprising:

a conductive pad arranged in the surrounding area, and located between the first substrate and the second sealing layer in a thickness direction of the first substrate, wherein the second sealing layer includes an aperture overlapping with the pad.

9. The display device of claim 8, wherein the pad is exposed from the adhesive layer.

10. The display device of claim 1, further comprising:

a dam structure including a plurality of protruding portions arranged in the surrounding area, wherein the second sealing layer covers at least a part of the dam structure.

11. The display device of claim 10, wherein a portion of the second sealing layer which covers the dam structure is covered with the adhesive layer.

12. The display device of claim 10, wherein the dam structure surrounds the display area.

13. The display device of claim 12, wherein the dam structure surrounds the conductive layer.

14. The display device of claim 10, further comprising:

a conductive pad arranged in the surrounding area, wherein the dam structure includes a first protruding portion located between the pad and the display area, and a second protruding portion located between the pad and the first protruding portion, the first protruding portion and the second protruding portion are covered with the second sealing layer, the adhesive layer covers a portion of the second sealing layer, which covers the first protruding portion, and the adhesive layer does not cover a portion of the second sealing layer, which covers the second protruding portion.

* * * * *